United States Patent
Chu et al.

(10) Patent No.: US 11,545,935 B2
(45) Date of Patent: Jan. 3, 2023

(54) OSCILLATOR WAFER-LEVEL-PACKAGE STRUCTURE

(71) Applicant: TXC CORPORATION, Taipei (TW)

(72) Inventors: Chih-Hsun Chu, Ping Cheng (TW);
Chih-Hung Chiu, Ping Cheng (TW);
Wun-Kai Wang, Ping Cheng (TW);
Hsiang-Jen Cheng, Ping Cheng (TW)

(73) Assignee: TXC Corporation, Taipei (TW)

( * ) Notice: Subject to any disclaimer, the term of this patent is extended or adjusted under 35 U.S.C. 154(b) by 0 days.

(21) Appl. No.: 17/330,855

(22) Filed: May 26, 2021

(65) Prior Publication Data
US 2021/0376792 A1    Dec. 2, 2021

(30) Foreign Application Priority Data

May 28, 2020   (TW) ................. 109117803

(51) Int. Cl.
*H03B 5/32*     (2006.01)
*H01L 41/053*   (2006.01)
*H01L 41/047*   (2006.01)

(52) U.S. Cl.
CPC ............. *H03B 5/32* (2013.01); *H01L 41/047* (2013.01); *H01L 41/053* (2013.01)

(58) Field of Classification Search
CPC ....... H03B 5/32; H01L 41/047; H01L 41/053; H03H 9/1035
See application file for complete search history.

(56) References Cited

U.S. PATENT DOCUMENTS

| 7,608,986 | B2  | 10/2009 | Yong et al. |
| 7,893,600 | B2* | 2/2011  | Furue .................. H03H 9/0561 310/344 |
| 9,209,781 | B2* | 12/2015 | Kubota ................ H01L 41/047 |

FOREIGN PATENT DOCUMENTS

| JP | 2018-133789 A | 8/2018 |
| TW | I396311 B     | 5/2013 |
| TW | I420810 B     | 12/2013 |
| TW | I469513 B     | 1/2015 |
| TW | I672838 B     | 9/2019 |

OTHER PUBLICATIONS

Official Action Issued By Foreign Patent Office in Corresponding International Application No. 11020955960/109117803, dated Sep. 30, 2021.

* cited by examiner

*Primary Examiner* — Jeffrey M Shin
(74) *Attorney, Agent, or Firm* — Rosenberg, Klein & Lee

(57) ABSTRACT

An oscillator wafer-level-package structure is provided, comprising a bottom layer, an oscillator crystal and a capping layer. The bottom layer includes an upper plane, the capping layer includes a lower plane, and the oscillator crystal is disposed between the bottom layer and the capping layer and includes at least one cavity. An upper seal ring and a lower seal ring are respectively surrounding the oscillator crystal such that the oscillator crystal is sealed in between the capping layer and the bottom layer by employing the upper and lower seal rings. In addition, a diffusion barrier is further disposed in the upper seal ring and in the lower seal ring for avoiding interface diffusion. Moreover, the present invention adopts the same material for fabricating the capping layer, the oscillator crystal and the bottom layer to achieve an optimal thermal stress result when realizing the packaging structure.

19 Claims, 9 Drawing Sheets

OSCILLATOR WAFER-LEVEL-PACKAGE STRUCTURE

BACKGROUND OF THE INVENTION

Field of the Invention

The present invention is related to an oscillator wafer-level-package (WLP) structure. More particularly, it is related to a WLP structure for an oscillator crystal, in which an upper surface and a lower surface of the oscillator crystal is respectively characterized by forming a cavity therein.

Description of the Related Art

As known, in accordance with the trend of system integration, a variety of electronic systems nowadays are equipped with clock components, and integrating the clock components with sensing elements into the electronic systems has become one of the mainstream technologies in semiconductor packaging technical field. Since taking a quartz crystal piezoelectric element as an oscillator provides an outstanding accuracy and stability, a quartz crystal is mostly adopted for performing as a clock component in the current practice. According to the International Electrotechnical Commission (IEC), quartz-crystal-piezoelectric-element oscillators include four categories: simple package crystal oscillators (SPXO), voltage-controlled crystal oscillators (VCXO), temperature-compensated crystal oscillators (TCXO) and oven-controlled crystal oscillators (OCXO). However, with the rapid developments of the IC industries, it is believed that electronic products tend to show more functions, higher performances, and lighter weight. As such, in order to meet the packaging requirements for high-intensity integration and miniaturization of semiconductor IC chips, it is obvious that the existing packaging technologies are no longer adequate.

In general, in accordance with the miniaturization of semiconductor piezoelectric devices, the quartz crystal and the integrated circuit are usually respectively packaged along with ceramic materials first, and the subsequent electrical connections are successively performed by employing the current existing technologies. However, since the packaging materials may melt due to heat and therefore cause a short circuit, or the quartz crystal may decline to contact with its bottom base layer, the existing packaging structure usually has a cavity on the surface of its bottom base layer so as to use such cavity for accommodating the quartz crystal. However, due to the constraints of the cavity spacing and the process capability of the bottom base layer, it cuts off the area for providing sufficient electrical connections in the piezoelectric elements, and makes the test process performed for the piezoelectric elements much more difficult, thereby causes decrease in the testing yields.

Furthermore, an U.S. Pat. No. 7,608,986 discloses a Quartz crystal resonator, related to a wafer-level-package structure, in which an upper cap and a lower base made of blue plate glass are anodic bonded with the quartz crystal so as to form a sandwich structure. Nevertheless, regarding the sandwich structure, wherein the thermal expansion coefficients of the base material and the quartz are different, the internal quartz crystal will encounter thermal stress when the temperature changes, which accordingly makes the piezoelectric oscillation frequency shift along with the changed temperature. Therefore, to avoid such issues, the cut corners of the quartz crystal wafer and the thermal expansion coefficients of the materials for fabricating the upper cap and the lower base must be carefully chosen, and sophisticated designs and regulations must be taken into considerations as well. However, it is believed that such actions will also increase the fabrication cost and human resources requirements greatly and dramatically.

Therefore, based on the prior arts as discussed above, it should be apparent and obvious that there is indeed an urgent need for the professionals in the field for a novel and inventive modified oscillator wafer-level-package structure to be developed, which can effectively solve those above mentioned problems occurring in the prior design. The specific structure and implementations will now be discussed in the following descriptions.

SUMMARY OF THE INVENTION

In order to overcome the above mentioned disadvantages of the prior arts, one major objective in accordance with the present invention is to provide an oscillator wafer-level-package (WLP) structure. The proposed oscillator wafer-level-package structure is novel and aimed to modify the location of the cavity such that the proposed cavity of the present invention is configured to be disposed on an upper surface and a lower surface of an oscillator crystal. By employing such an inventive structural diagram, the proposed oscillator wafer-level-package structure of the present invention is obtained.

Another objective in accordance with the present invention is to provide an oscillator wafer-level-package structure, in which a diffusion barrier is provided between the interface metal layer and the connecting metal layer of the seal rings. The diffusion barrier can be made of a material selected from a group consisting of ruthenium (Ru), titanium (Ti) or an alloy of Ru and Ti, organic polymers, and oxides for preventing interface diffusion.

And yet another objective in accordance with the present invention is to design a capping layer, an oscillator crystal and a bottom layer of the WLP structure to have the same or similar thermal expansion coefficient. As such, the present invention succeeds in achieving an optimal thermal stress result when realizing the packaging structure.

In view of the above many objectives of the invention, the present invention is aimed to disclose an oscillator wafer-level-package structure, which comprises a bottom layer including an upper plane, a capping layer including a lower plane, and an oscillator crystal disposed between the upper plane of the bottom layer and the lower plane of the capping layer and includes at least one cavity. The at least one cavity is formed in the oscillator crystal, and formed on an upper surface or a lower surface of the oscillator crystal. Alternatively, two of the at least one cavity can be formed on an upper surface of the oscillator crystal and a lower surface of the oscillator crystal, respectively. Therefore, according to one embodiment of the present invention, by direct bonding the lower plane of the capping layer with the upper plane of the bottom layer, the oscillator crystal can be sealed in between the capping layer and the bottom layer.

According to another embodiment of the present invention, an upper seal ring is further formed between the lower plane of the capping layer and the oscillator crystal. A lower seal ring is further formed between the upper plane of the bottom layer and the oscillator crystal. The upper seal ring and the lower seal ring are respectively surrounding the oscillator crystal such that the oscillator crystal is sealed in between the capping layer and the bottom layer by employing the upper seal ring and the lower seal ring.

And in the upper seal ring and the lower seal ring, two interface metal layers and one connecting metal layer are provided. The two interface metal layers of the upper seal ring are connected with the capping layer and the oscillator crystal, respectively. The two interface metal layers of the lower seal ring are connected with the bottom layer and the oscillator crystal, respectively. A diffusion barrier is further disposed between each of the interface metal layers and the connecting metal layer. And, the diffusion barrier, for example, can be made of a material selected from a group consisting of ruthenium (Ru), titanium (Ti) or an alloy of Ru and Ti, organic polymers, and oxides.

In a preferred embodiment of the present invention, the interface metal layers can be made of chromium (Cr). The connecting metal layer can be made of gold (Au), tin (Sn) or an alloy of Au and Sn.

And moreover, for an optimization of package structure stress intensity, in one embodiment of the present invention, the capping layer and the bottom layer are designed to have the same or similar thermal expansion coefficient in order to prevent the thermal stress issues when sealing the package structure. For instance, the thermal expansion coefficient of the capping layer and the bottom layer disclosed by the present invention is in a range between $2*10^{-7}/K$ and $9*10^{-7}/K$. And furthermore, in a preferred embodiment of the present invention, a material of all the capping layer, the oscillator crystal and the bottom layer used in the oscillator wafer-level-package structure can be selected as quartz.

In addition, the proposed technical contents of the present invention can be further combined with TQV (Through Quartz via) technology to form at least one metal via. By employing the at least one metal via penetrating the wafer and providing electrical connections, high-density connections between process chips can be provided. And thus, an even more optimized integration technique between wafer manufacturing in the front-end process and packaging process in the back-end process is obtained.

As a result, on account of the technical solution provided by the present invention, it is believed that, apparently, the present invention effectively solves those conventional problems arising from the prior technology. And these and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION OF THE INVENTION

Figure 1:
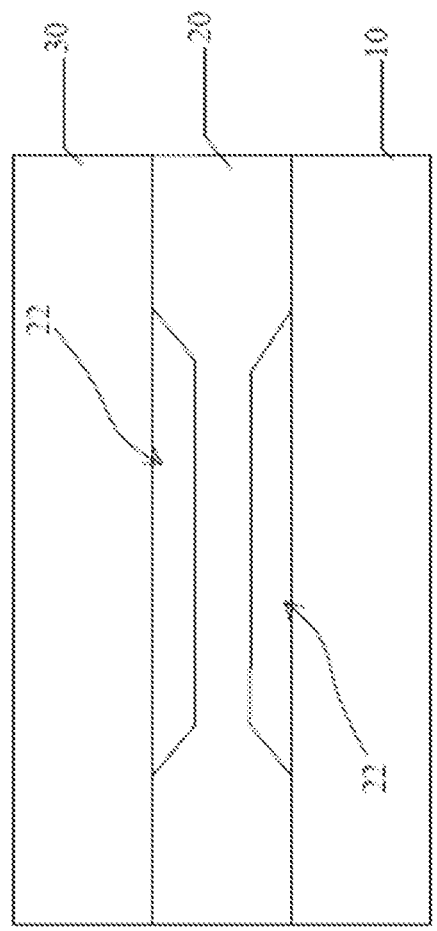
FIG. 1 shows a schematical diagram of an oscillator wafer-level-package structure in accordance with one embodiment of the present invention.

Reference will now be made in detail to the preferred embodiments of the present invention, examples of which are illustrated in the accompanying drawings. Wherever possible, the same reference numbers are used in the drawings and the description to refer to the same or like parts. Detailed descriptions thereof will be provided as follows. The embodiments described below are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

Please refer to FIG. 1, which shows a schematical diagram of an oscillator wafer-level-package structure in accordance with one embodiment of the present invention. The oscillator wafer-level-package (WLP) structure comprises a bottom layer 10, an oscillator crystal 20 and a capping layer 30. The oscillator crystal 20, for example, can be an AT-cut quartz crystal resonator, a tuning-fork type (U-shaped) quartz crystal resonator, or other mechanical resonance type resonators. In general, an upper electrode and a lower electrode can be respectively formed on an upper surface and a lower surface of the oscillator crystal 20 as exciting electrodes, and conductive bumps are electrically connected thereto to provide electrical connections to a plurality of metal pads on the bottom layer 10, so as to excite and activate the oscillator crystal 20 (which will be discussed later). In one embodiment of the present invention, said conductive bumps, for instance, can be made of metal, such as gold, copper, tin, silver, indium or an alloy of these materials. Alternatively, said conductive bumps can also be made of conductive adhesives composed of silver particles and resin.

According to the embodiment of the present invention, the bottom layer 10 includes an upper plane, and the capping layer 30 includes a lower plane. The oscillator crystal 20 is disposed between the bottom layer 10 and the capping layer 30, and at least one cavity 22 is formed in the oscillator crystal 20. The embodiment shown in FIG. 1 is one embodiment of the present invention when the cavity 22 is formed on both an upper surface of the oscillator crystal 20 and a lower surface of the oscillator crystal 20. However, according to other embodiments of the present invention, the cavity 22 may also be, selectively formed on either an upper surface of the oscillator crystal 20 or a lower surface of the oscillator crystal 20. As referring to the embodiment as shown in FIG. 1, by direct bonding the lower plane of the capping layer 30 with the upper plane of the bottom layer 10, the oscillator crystal 20 can be sealed in between the capping layer 30 and the bottom layer 10, in which the sealing internal environment can be vacuum or filled with helium, for example.

Figure 2:
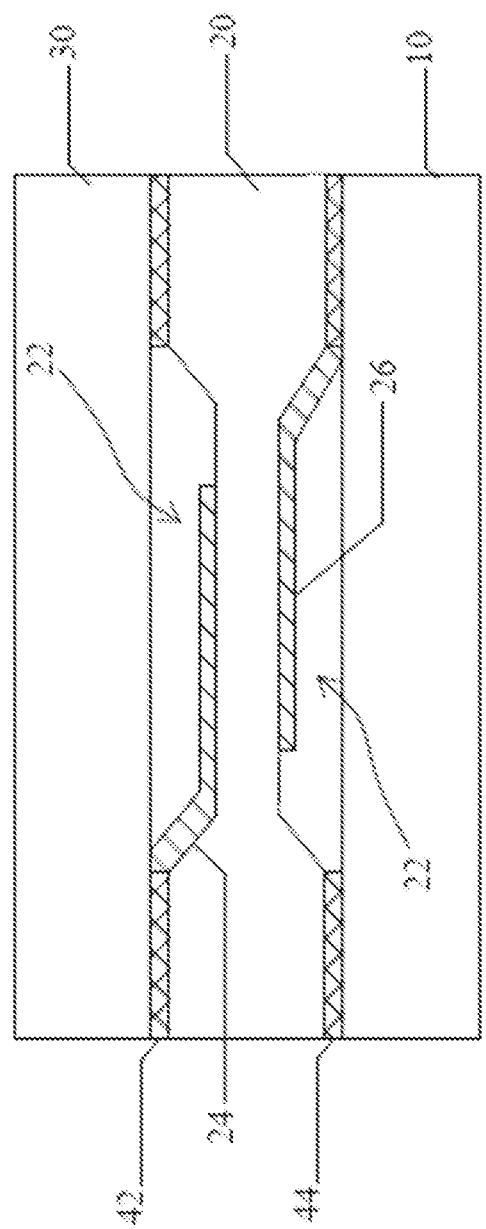
FIG. 2 shows a schematical diagram of an oscillator wafer-level-package structure in accordance with another embodiment of the present invention.

FIG. 2 shows a schematical diagram of an oscillator wafer-level-package structure in accordance with another embodiment of the present invention. What differs from FIG. 1 is that, in addition to the previously disclosed bottom layer 10, oscillator crystal 20 and capping layer 30, the oscillator wafer-level-package (WLP) structure in the second embodiment as shown in FIG. 2 further comprises an upper seal ring 42 and a lower seal ring 44. The upper seal ring 42 is formed between the lower plane of the capping layer 30 and the oscillator crystal 20, and the lower seal ring 44 is formed between the upper plane of the bottom layer 10 and the oscillator crystal 20. The upper seal ring 42 and the lower seal ring 44 are respectively surrounding the oscillator crystal 20, such that the oscillator crystal 20 can be sealed in between the capping layer 30 and the bottom layer 10 by employing the upper seal ring 42 and the lower seal ring 44. Therefore, when the upper seal ring 42 and the capping layer 30 are jointed with the lower seal ring 44 and the bottom layer 10 along with the oscillator crystal 20, the present invention achieves to seal the oscillator crystal 20 there in between and provide better impermeability. Meanwhile, an upper electrode and a lower electrode can be respectively formed on the upper surface and the lower surface of the oscillator crystal 20 as an upper exciting electrode 24 and a lower exciting electrode 26 as shown in the figure, so as to excite and activate the oscillator crystal 20. In other words, as referring to the embodiment as illustrated in FIG. 2, by jointing the upper seal ring 42 and the capping layer 30 together with the lower seal ring 44 and the bottom layer 10, the oscillator crystal 20 can be sealed inside, wherein the sealing internal environment can be vacuum or filled with helium, for example.

Moreover, since a variety of foregoing shortcomings as mentioned earlier in the prior arts, including high fabrication cost and unstable supply resources when using the current ceramic material packaging technology as well as the thermal stress issue caused by the sandwich-shaped package structure are still not effectively solved, the present invention is aimed to design the capping layer 30 and the bottom layer 10 to have similar thermal expansion coefficients, in order to avoid the thermal stress issue when performing sealing and thus can meet the optimization of structural stress intensity. Specifically, the thermal expansion coefficient of the capping layer 30 and the bottom layer 10 can be controlled in a range between $2*10^{-7}/K$ and $9*10^{-7}/K$. Furthermore, in one embodiment of the present invention, a material of all the proposed capping layer 30, oscillator crystal 20 and bottom layer 10 can be selected as quartz to have an optimal thermal stress result when realizing the sealing package structure.

Figure 3:
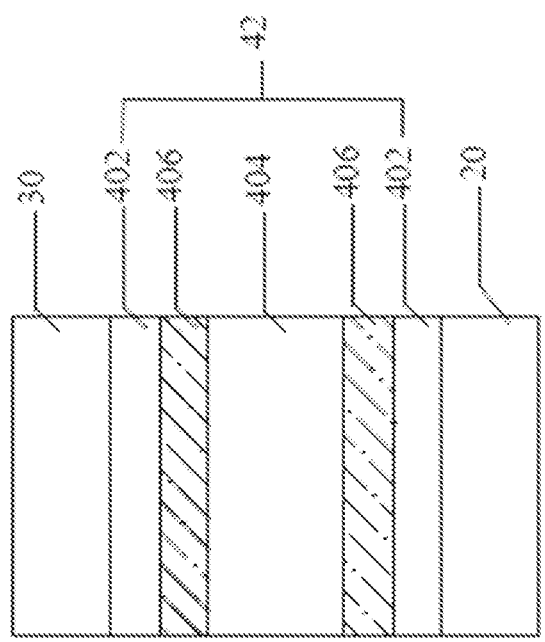
FIG. 3 shows a cross sectional view of the upper seal ring according to the embodiment of the present invention.

In another aspect, another objective of the present invention is to prevent interface diffusion. Please refer to FIG. 3 and FIG. 4, which respectively shows a cross sectional view of the upper seal ring 42 and the lower seal ring 44 according to the embodiment of the present invention. As illustrated in FIG. 3, the upper seal ring 42 comprises two interface metal layers 402 and one connecting metal layer 404, wherein the two interface metal layers 402 are connected with the capping layer 30 and the oscillator crystal 20, respectively. In addition, a diffusion barrier 406 is further disposed between each of the interface metal layers 402 and the connecting metal layer 404. For instance, the diffusion barrier 406 can be made of a material selected from the group consisting of ruthenium (Ru), titanium (Ti) or an alloy of Ru and Ti, organic polymers, and oxides.

Figure 4:
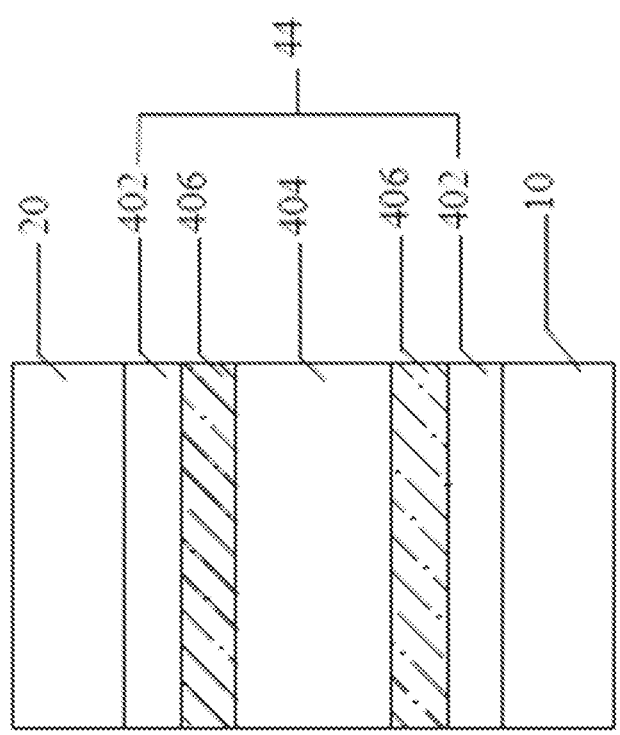
FIG. 4 shows a cross sectional view of the lower seal ring according to the embodiment of the present invention.

Similarly, please refer to FIG. 4. The lower seal ring 44 comprises two interface metal layers 402 and one connecting metal layer 404, wherein the two interface metal layers 402 are connected with the bottom layer 10 and the oscillator crystal 20, respectively. And also, a diffusion barrier 406 is further disposed between each of the interface metal layers 402 and the connecting metal layer 404. The diffusion barrier 406, for example, can be made of a material selected from the group consisting of ruthenium (Ru), titanium (Ti) or an alloy of Ru and Ti, organic polymers, and oxides.

In a preferred embodiment of the present invention, the interface metal layers 402 can be made of chromium (Cr) and each of the interface metal layers 402 has a thickness of 10 nanometers (nm), for instance. The connecting metal layer 404 can be made of gold (Au), tin (Sn) or an alloy of Au and Sn, and has a thickness of 30 nm to 70 nm, for instance. And the diffusion barrier 406 disposed there in between the interface metal layer 402 and the connecting metal layer 404, for instance, can have a thickness of 10 nm. According to the technical contents and solutions proposed by the present invention, people having ordinary knowledge backgrounds and skilled in the art are allowed to vary their own design patterns depending on the actual implementation fields and practice products, nevertheless, which still fall into the scope of the present invention. The several illustrative embodiments of the present invention provided in the foregoing paragraphs are described to explain the main technical features of the present invention so well that those skilled in the art are able to understand and implement according to the present invention. The present invention is certainly not limited thereto these illustrative embodiments.

On the other hand, in the following paragraphs, the present invention further provides at least three various implementations of applying the disclosed embodiments of the present invention to the TQV (through Quartz via) technology.

Figure 5:
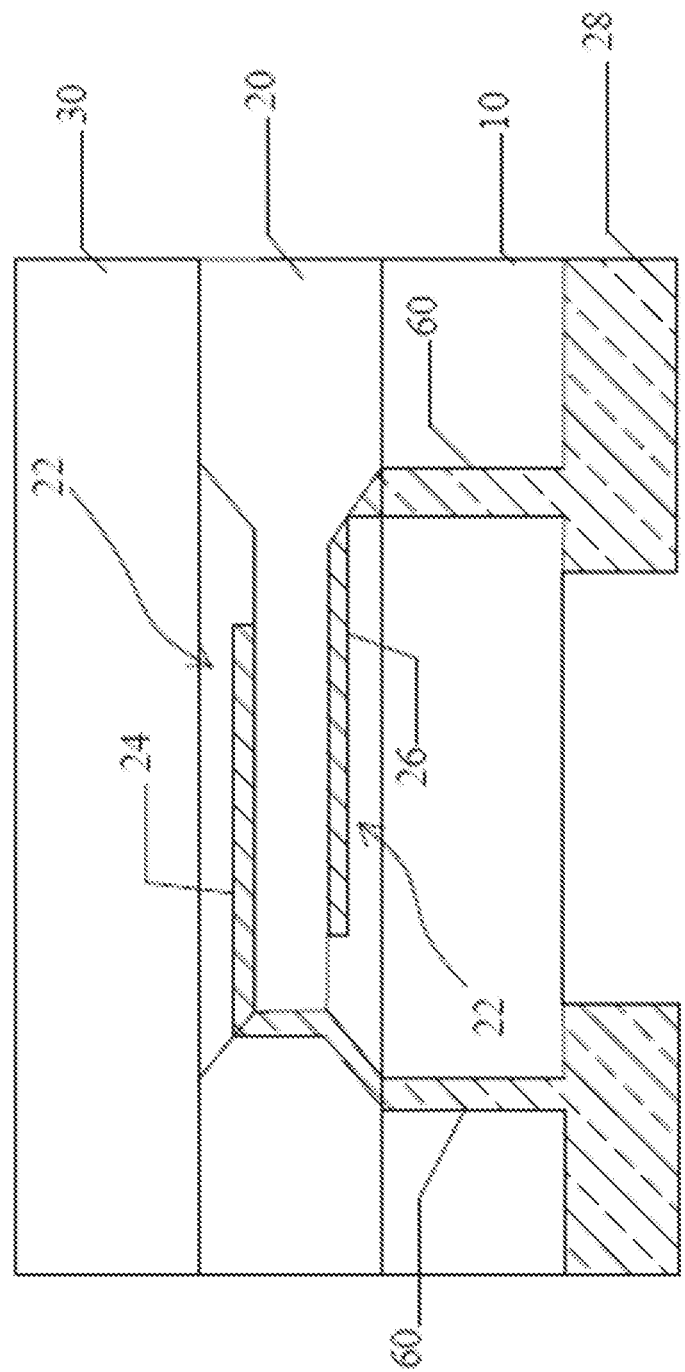
FIG. 5 schematically shows an illustrative structural diagram when applying the disclosed embodiment in FIG. 1 of the present invention to the TQV technology.

At first, please refer to FIG. 5, which schematically shows an illustrative structural diagram when applying the disclosed embodiment in FIG. 1 of the present invention to the TQV technology. In FIG. 5, the material of the proposed capping layer 30, oscillator crystal 20 and bottom layer 10 is determined as quartz. And, the upper exciting electrode 24 and the lower exciting electrode 26 are respectively formed on the upper surface and the lower surface of the oscillator crystal 20. In addition, the upper exciting electrode 24 is disposed in the cavity 22 of the upper surface, and the lower exciting electrode 26 is disposed in the cavity 22 of the lower surface. A bottom metal layer 28 is formed on an underneath layer of the bottom layer 10. At least one via hole 60 for providing electrical conduction penetrates through the bottom layer 10 such that the bottom metal layer 28 is able to extend upward to fill the via hole 60 and form at least one metal via so as to electrically connect to the above mentioned upper exciting electrode 24, lower exciting electrode 26 and the bottom metal layer 28. By employing such configurations, it provides the signal inputs and outputs (I/O) of the wafer-level package (WLP) structure.

Figure 6:
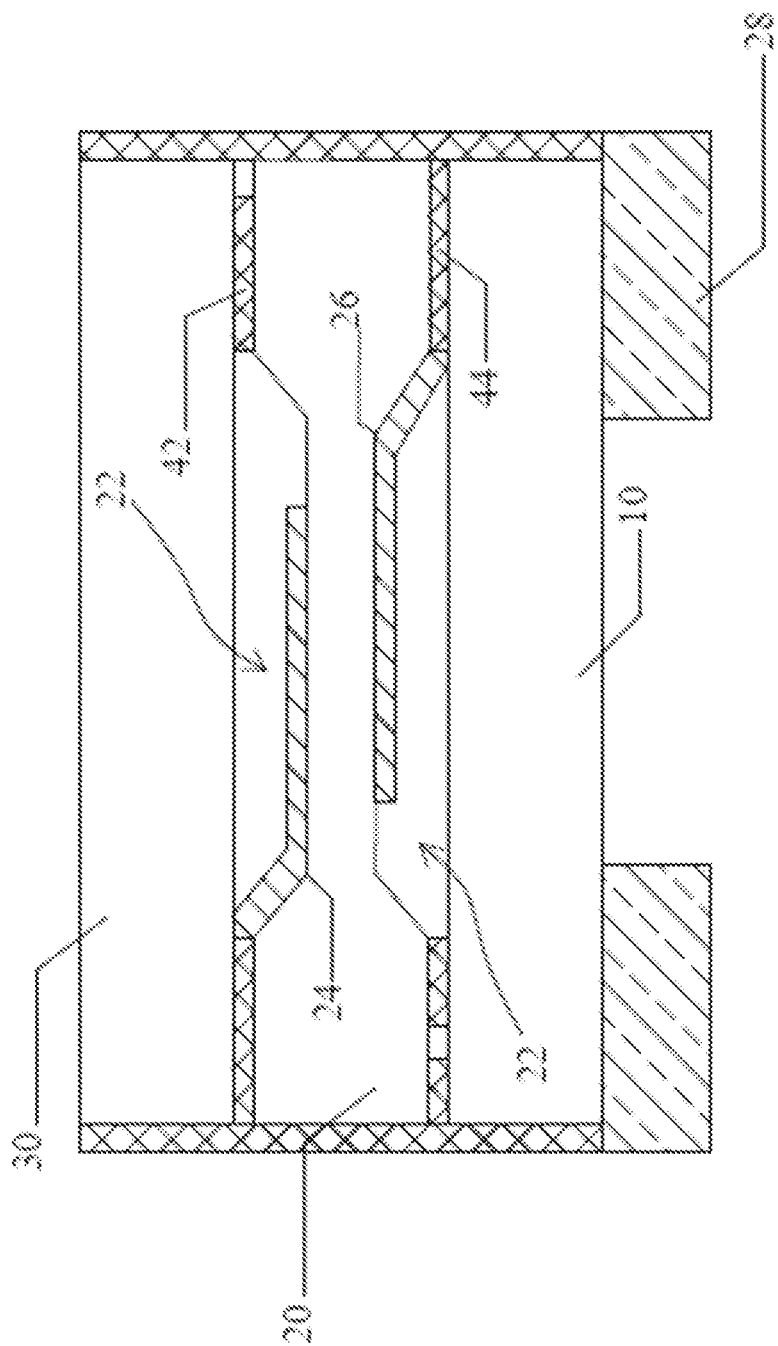
FIG. 6 schematically shows another illustrative structural diagram when applying the disclosed embodiment in FIG. 2 of the present invention to the TQV technology.

Subsequently, please refer to FIG. 6, which schematically shows another illustrative structural diagram when applying the disclosed embodiment in FIG. 2 of the present invention to the TQV technology. In FIG. 6, the material of the proposed capping layer 30, oscillator crystal 20 and bottom layer 10 is determined as quartz. And, the upper exciting electrode 24 and the lower exciting electrode 26 are respectively formed on the upper surface and the lower surface of the oscillator crystal 20. In addition, the upper exciting electrode 24 is disposed in the cavity 22 of the upper surface, and the lower exciting electrode 26 is disposed in the cavity 22 of the lower surface. Meanwhile, the upper exciting electrode 24 is electrically connected with the previously described upper seal ring 42, and the lower exciting electrode 26 is electrically connected with the previously described lower seal ring 44. A bottom metal layer 28 is formed on an underneath layer of the bottom layer 10. At least one via hole for providing electrical conduction can be disposed in the upper seal ring 42 and the lower seal ring 44, so as to electrically connect to the bottom metal layer 28. By employing such configurations, it provides external signal connectivity and signal inputs and outputs (I/O) of the wafer-level package (WLP) structure.

Figure 7:
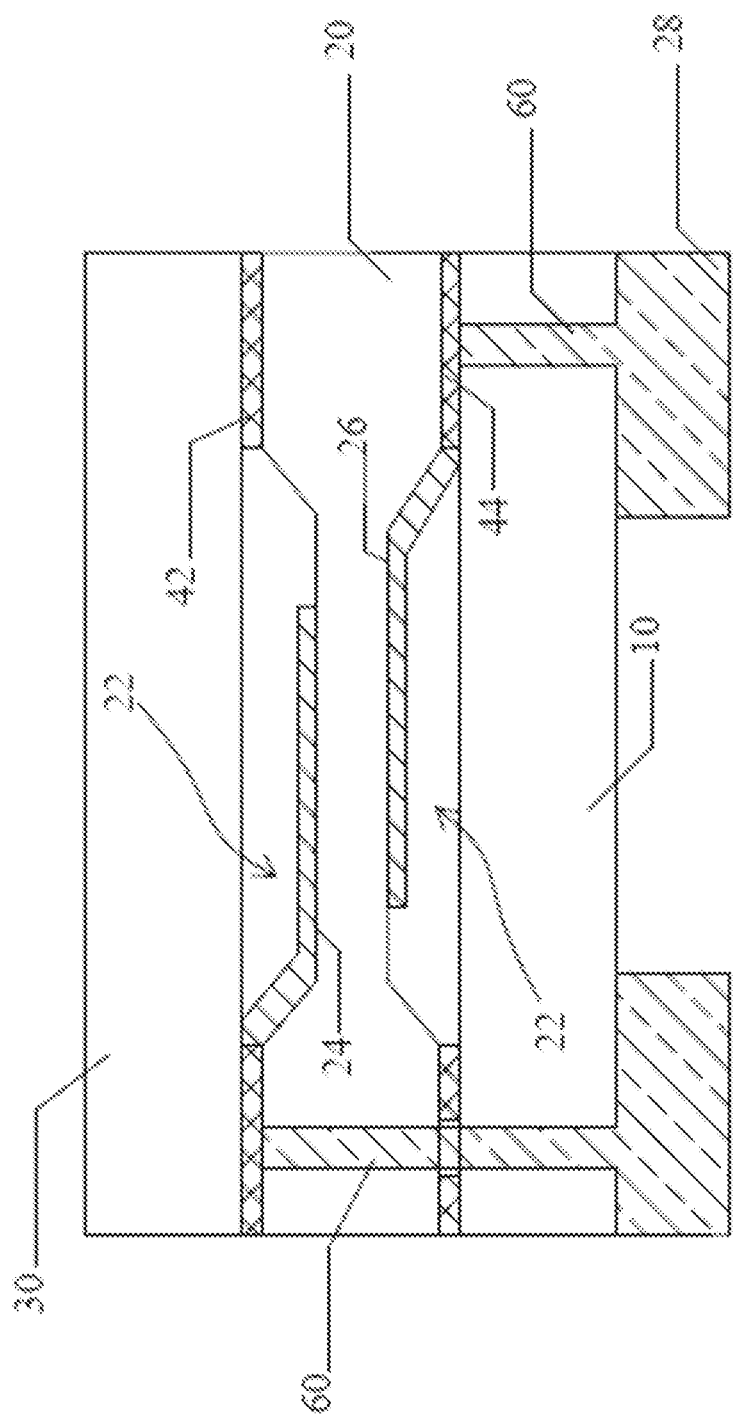
FIG. 7 schematically shows one another illustrative variation structural diagram when applying the disclosed embodiment in FIG. 2 of the present invention to the TQV technology.
Figure 8:
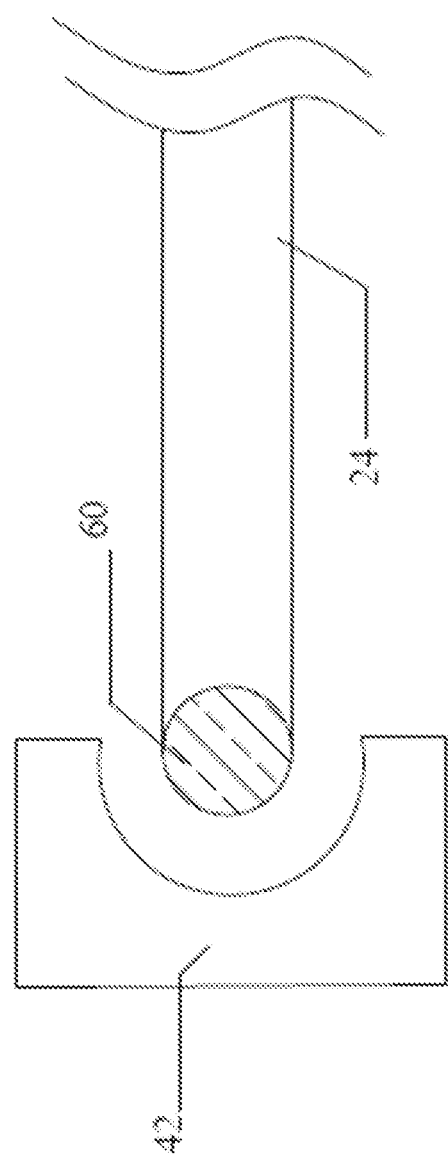
FIG. 8 shows an upper view of the upper exciting electrode in FIG. 7.

And furthermore, please refer to FIG. 7, which schematically shows one another illustrative variation structural diagram when applying the disclosed embodiment in FIG. 2 of the present invention to the TQV technology. In FIG. 7, the material of the proposed capping layer 30, oscillator crystal 20 and bottom layer 10 is determined as quartz. And, the upper exciting electrode 24 and the lower exciting electrode 26 are respectively formed on the upper surface and the lower surface of the oscillator crystal 20. In addition, the upper exciting electrode 24 is disposed in the cavity 22 of the upper surface, and the lower exciting electrode 26 is disposed in the cavity 22 of the lower surface. Meanwhile, the upper exciting electrode 24 further extends adjacent to the upper seal ring 42, and the lower exciting electrode 26 further extends adjacent to the lower seal ring 44. Specifically, please refer to FIG. 8 at the same time, in which FIG. 8 shows an upper view of the embodiment. It can be observed that at least one via hole 60 is formed in the upper exciting electrode 24 adjacent to the upper seal ring 42. A bottom metal layer 28 is formed on an underneath layer of the bottom layer 10. The via hole 60 for providing electrical conduction penetrates through the lower seal ring 44 and the bottom layer 10 such that the bottom metal layer 28 is able to extend upward to fill the via hole 60 and form at least one metal via. According to the embodiment of the present invention, a material of the bottom metal layer 28 can be, and yet not limited to, copper (Cu).

Figure 9:
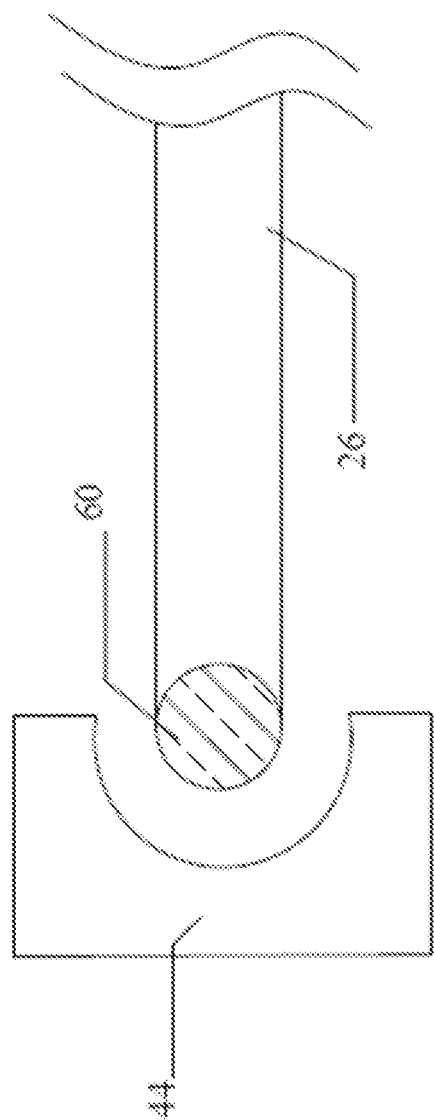
FIG. 9 shows an upper view of the lower exciting electrode in FIG. 7.

Similarly, regarding the lower exciting electrode 26 configured on the right-hand side of the oscillator crystal 20 as shown in FIG. 7, the via hole 60 can be designed to form in the lower exciting electrode 26 adjacent to the lower seal ring 44. Such configuration is illustrated as shown in FIG. 9. It can be observed that the via hole 60 is formed in the lower exciting electrode 26 adjacent to the lower seal ring 44 and the via hole 60 penetrates downward the bottom layer 10 such that the bottom metal layer 28 is able to extend upward to fill the via hole 60 and form at least one metal via, providing electrical conductions. According to the embodiment of the present invention, a material of the bottom metal layer 28, for example, can be copper (Cu). Nevertheless, the present invention is certainly not limited thereto.

As a result, to sum up, it is believed that the embodiments described above are illustrated to merely demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

Therefore, in view of the above, it is obvious that the oscillator wafer-level package (WLP) structure disclosed by the present invention achieves to solve the restricted manufacturing process problems occurring in the prior arts due to the conventional cavity which requires to be directly configured on the surface of the bottom layer in the traditional WLP structure. And also, the present invention solves the obstacles (including high product cost and unstable supply, etc.), that only ceramic material could be used for forming package structures, and thus improves the thermal stress caused by the sandwich-shaped package structure by adopting the same material for forming the capper layer, the oscillator crystal, and the bottom layer of the WLP structure. As a result, when compared to the plurality of prior arts, the present invention further proposes a diffusion barrier for effectively preventing interface diffusion problems. And therefore, it is evident that the present invention apparently shows much more effective performances than before. As such, it is believed that the present invention is definitely instinct, effective and highly competitive for semiconductor technologies and industries in the market nowadays, whereby having extraordinary availability and competitiveness for future industrial developments and being in condition for early allowance.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. An oscillator wafer-level-package structure, comprising:
   a bottom layer including an upper plane;
   an oscillator crystal disposed on the upper plane of the bottom layer, wherein at least one cavity is formed in the oscillator crystal;
   a capping layer disposed on the oscillator crystal and including a lower plane, wherein the capping layer uses the lower plane and the bottom layer uses the upper plane to seal the oscillator crystal;
   an upper seal ring, which is formed between the lower plane of the capping layer and the oscillator crystal; and
   a lower seal ring, which is formed between the upper plane of the bottom layer and the oscillator crystal, wherein the upper seal ring and the lower seal ring are respectively surrounding the oscillator crystal such that the oscillator crystal is sealed in between the capping layer and the bottom layer by employing the upper seal ring and the lower seal ring.

2. The oscillator wafer-level-package structure according to claim 1, wherein the at least one cavity is formed on an upper surface of the oscillator crystal.

3. The oscillator wafer-level-package structure according to claim 1, wherein the at least one cavity is formed on a lower surface of the oscillator crystal.

4. The oscillator wafer-level-package structure according to claim 1, wherein two of the at least one cavity are formed on an upper surface of the oscillator crystal and a lower surface of the oscillator crystal, respectively.

5. The oscillator wafer-level-package structure according to claim 1, wherein the upper seal ring comprises two interface metal layers and a connecting metal layer, the two interface metal layers are respectively connected with the capping layer and the oscillator crystal, and wherein a diffusion barrier is further disposed between each of the two interface metal layers and the connecting metal layer, and the diffusion barrier is made of a material selected from a group consisting of ruthenium (Ru), titanium (Ti) or an alloy of Ru and Ti, organic polymers, and oxides.

6. The oscillator wafer-level-package structure according to claim 1, wherein the lower seal ring comprises two interface metal layers and a connecting metal layer, the two interface metal layers are respectively connected with the bottom layer and the oscillator crystal, and wherein a diffusion barrier is further disposed between each of the two interface metal layers and the connecting metal layer, and the diffusion barrier is made of a material selected from a group consisting of ruthenium (Ru), titanium (Ti) or an alloy of Ru and Ti, organic polymers, and oxides.

7. The oscillator wafer-level-package structure according to claim 4, wherein an upper exciting electrode and a lower exciting electrode are respectively formed on the upper surface and the lower surface of the oscillator crystal, and each of the upper exciting electrode and the lower exciting electrode is correspondingly disposed in the at least one cavity, and wherein a bottom metal layer is formed on an underneath layer of the bottom layer, at least one via hole penetrates through the bottom layer such that the bottom metal layer extends upward to fill the at least one via hole and form at least one metal via so as to electrically connect to the upper exciting electrode, the lower exciting electrode and the bottom metal layer for providing signal inputs and outputs.

8. The oscillator wafer-level-package structure according to claim 1, wherein an upper exciting electrode and a lower exciting electrode are respectively formed on the upper surface and the lower surface of the oscillator crystal, and each of the upper exciting electrode and the lower exciting electrode is correspondingly disposed in the at least one cavity, and wherein the upper exciting electrode is electrically connected with the upper seal ring, and the lower exciting electrode is electrically connected with the lower seal ring for providing signal inputs and outputs.

9. The oscillator wafer-level-package structure according to claim 1, wherein an upper exciting electrode and a lower exciting electrode are respectively formed on the upper surface and the lower surface of the oscillator crystal, and each of the upper exciting electrode and the lower exciting electrode is correspondingly disposed in the at least one cavity, and wherein the upper exciting electrode further extends adjacent to the upper seal ring, and the lower exciting electrode further extends adjacent to the lower seal ring.

10. The oscillator wafer-level-package structure according to claim 9, wherein at least one via hole is formed in the upper exciting electrode adjacent to the upper seal ring and formed in the lower exciting electrode adjacent to the lower seal ring.

11. The oscillator wafer-level-package structure according to claim 10, further comprising a bottom metal layer formed on an underneath layer of the bottom layer, wherein the at least one via hole penetrates through the lower seal ring and the bottom layer such that the bottom metal layer extends upward to fill the at least one via hole and form at least one metal via.

12. The oscillator wafer-level-package structure according to claim 1, wherein a thermal expansion coefficient of the capping layer and the bottom layer is in a range between $2*10^{-7}/K$ and $9*10^{-7}/K$.

13. The oscillator wafer-level-package structure according to claim 1, wherein a material of the capping layer, the oscillator crystal and the bottom layer is quartz.

14. The oscillator wafer-level-package structure according to claim 7, wherein a material of the bottom metal layer is copper (Cu).

15. The oscillator wafer-level-package structure according to claim 11, wherein a material of the bottom metal layer is copper (Cu).

16. The oscillator wafer-level-package structure according to claim 5, wherein a material of the two interface metal layers is chromium (Cr).

17. The oscillator wafer-level-package structure according to claim 6, wherein a material of the two interface metal layers is chromium (Cr).

18. The oscillator wafer-level-package structure according to claim 5, wherein a material of the connecting metal layer is gold (Au), tin (Sn) or an alloy of Au and Sn.

19. The oscillator wafer-level-package structure according to claim 6, wherein a material of the connecting metal layer is gold (Au), tin (Sn) or an alloy of Au and Sn.

* * * * *